United States Patent [19]

Nambu et al.

[11] Patent Number: 5,023,185

[45] Date of Patent: Jun. 11, 1991

[54] METHOD FOR DETERMINING RESOLUTION POWER OR DISCRIMINATION CAPACITY OF AN NMR IMAGING APPARATUS

[75] Inventors: Masao Nambu, Yokohama; Naoaki Yamada, Suita, both of Japan

[73] Assignee: Nippon Oil Co., Ltd., Tokyo, Japan

[21] Appl. No.: 445,908

[22] Filed: Dec. 4, 1989

Related U.S. Application Data

[63] Continuation of Ser. No. 133,015, Dec. 15, 1987, abandoned.

[30] Foreign Application Priority Data

Dec. 17, 1986 [JP] Japan ............................. 61-298656

[51] Int. Cl.[5] ............................................. G01N 24/08
[52] U.S. Cl. ....................................... 436/8; 128/659; 324/308; 324/311; 436/173
[58] Field of Search ........................... 436/8–18, 436/173, 806; 424/4, 9; 128/654, 655, 659; 324/308, 311

[56] References Cited

U.S. PATENT DOCUMENTS

| | | | |
|---|---|---|---|
| 4,729,892 | 3/1988 | Beall | 128/653 |
| 4,774,957 | 10/1988 | Nambu et al. | 524/557 |

*Primary Examiner*—Robert J. Hill, Jr.
*Attorney, Agent, or Firm*—Majestic, Parsons, Siebert & Hsue

[57] ABSTRACT

A phantom for diagnosis by nuclear magnetic resonance imaging comprises a container made of a synthetic resin and a hydrogel sealingly contained in the container. The container has at least one opening into which a sample material is inserted. The hydrogel is prepared by charging an aqueous solution of a polyvinyl alcohol into the container, cooling the aqueous solution to minus 10°C. or lower to obtain a cooled frozen mass and thawing the cooled frozen mass. Also disclosed is a method for determining resolution power or discrimination capacity of an NMR imaging apparatus.

16 Claims, 1 Drawing Sheet

METHOD FOR DETERMINING RESOLUTION POWER OR DISCRIMINATION CAPACITY OF AN NMR IMAGING APPARATUS

This is a continuation of application Ser. No. 133,015, filed Dec. 15, 1987, now abandoned.

BACKGROUND OF THE INVENTION

The present invention relates to a model equivalent to living tissue, such as a simulating image, phantom or reference material, which is required in maintenance, inspection, servicing, adjustment and appraisal of a system used for diagnosis by nuclear magentic resonance (NMR) imaging and which is also required in analysis and study of the images obtained by the NMR diagnosis.

Throughout the following description in this specification and appended claims, such models simulating or equivalent to living tissues will be referred to as "phantoms". It will be also noted that the expression "diagnosis by nuclear magnetic resonance" or "NMR diagnosis" used herein means the diagnosis of a certain lesion site by the analysis of the NMR image.

The method for the diagnosis of an internal site of a living body, for instance, to have an information concerning a certain lesion site or a condition of blood stream, is generally referred to as the NMR imaging method, the NMR tomographical diagnosis method, the NMR imaging method, MRI (magnetic resonance imaging) method, the MMR (medical magnetic resonance) method, the MNI (multi-nuclear imaging) method and the NMR-CT (computerized or computer assisted tomography) method. In such a method, a living body is placed in a static magnetic field and a radio-frequency wave having a high frequency corresponding to the resonance wave length is applied so that the atomic nuclei of hydrogen or proton in the living tissue are exited, and then the magnetic informations generated from the thus excited atomic nuclei are detected as the output signals to form an image by such output informations. Such an image includes the nuclear magnetic informations concerning the concentration of protons contained in the living tissue (which gives an information concerning the water content in the living tissue), those concerning the spin-lattice (longitudinal) relaxation time ($T_1$) and those concerning the spin-spin (transverse) relaxation time ($T_2$). By analysing the image, the condition of the lesion site may be discriminated, and the distribution of the blood stream velocity in the living tissue may be imaged. The NMR imaging method is expected as a novel tool for the early stage diagnosis of a variety of diseases, since it is superior over or overcoming the demerits of the known X-ray tomography, DSA (digital subtraction angiography), PET or PE-CT (positron emission tomography) and US (ultrasonic method) for the reasons that any desired cross section of a living tissue can be imaged without trepassing internally of the living tissue, without being disturbed by the bones or air in the respiratory organs, and without any apprehension of exposure by a radioactive isotope or X-ray. (In this connection, reference should be made to C. L. Partain et al., "Nuclear Magnetic Resonance Imaging" (1983), W. B. Sanders Co.) However, the conventional system used for the NMR diagnosis is inferior in operational stability when compared with the stabilities of the systems used for the X-ray-CT and PE-CT methods. In practice of the NMR imaging, the system used therefor must always be paid with continuous care as to its maintenance, inspection, servicing, adjustment and appraisal of the performance characteristics.

In general, the device for reading out an information and the display device incorporated in the NMR system used for the chemical analysis are computerized, and it has been pointed out that "there is a grave tendency that exceedingly many chemists apt to accept the displayed data as accurate analytical results without taking what has been done in the system into account." In the NMR system for diagnosis, the control system, the manual for operations and the mode of imaging have not yet been standardized, often leading to difficulty in study and analysis of the image. Under such circumstances, certain erroneous diagnoses have been specifically pointed out and there is earnest demand for the search and establishment of a standard probe used for inspecting the operational condition of the system (E. L. Madsen, "Mag. Res. Imag.", 1, 135 (1982)).

The performance characteristics of NMR systems are significantly affected by the maintenance, control and adjustment operations. In addition, influences by magnetic materials, such as steel or iron used to construct a building in which the NMR system is housed, must be amended by the provision of a symmetrical coil. It is further necessary to adjust the frequency and to adjust the static magnetic field by amending or compensating the influences due to magnetic field established by radio frequency waves or plate-shape magnetic wave sources. However, significant difficulties are encountered in such adjustment or amendment operations. Furthermore, since the system cannot be assembled precisely in accordance with the theory and design thereof, similar to general precise mechanical instruments, there is frequently pointed out the uneven orientation of the static magnetic field in the transverse direction, and it is hard to perfectly amend such an uneven orientation of the magnetic field. Although it is convenient from the economical standpoint of view to lessen the magnetic field in order to improve the uniformity of the static magnetic field, it is meaningless to provide an NMR system for handling a small sample or test specimen when the system is to be used for the diagnosis of a human body. It should also be appreciated that a large scale magnet used for the diagnosis of a human body is accompanied with various imperfections which are not corrected or amended to give satisfactory data since any standard therefor has not yet been established at the present day (See D.J. Hoult, Rev. Sci. Instrum., 56 (1) 131 (1985) and R. T. Droege et al., "Radiology", 148, 763 (1983).).

In the meantime, the operation of the system also involves many problems which should be born in mind of the operator or the analyst. For example, the level of the radio frequency wave and the pulse interval should be properly selected, and the scanning speed should be pertinently set not to reduce the resolution power of the system, depending on the conditions of the disease. Furthermore, the NMR signals depend on the specific type of the system used, particularly on the intensity of the static magnetic field in the system, and the conversion factor between different systems cannot be determined monistically, as reported by I. Young, "Electronics & Power", 1984, March, 205. Moreover, even when the same system is used, the $T_1$ and $T_2$ (image signals) vary in response to the pulse interval ($T_r$), the delay time ($T_d$) and the echo time ($T_e$). However, the photographing condition for imaging cannot be set monistically to a certain condition. In detail, the difference (i.e. the contrast between the image of normal tissue and that of diseased site) in the NMR signal induced by the change due to a morbid state is to be discriminated by the NMR diagnosis. However, since more than an hour is expensed for individual imaging by calculation of the NMR signals (proton density $\rho$, $T_1$ and $T_2$) and since special value cannot always be expected by such individual imaging, it is a common practice to form an image including all of the above factors as a prompt measure. In such a case, rather than taking the aforementioned three factors equally into account, the endeavour is directed to the establishment of an image having clear contrast so as to have the maximum discrimination ability for discriminating the lesion site by imaging the respective factors through the non-uniformly weighed addition (while adopting the trial-and-error method) in response to the condition of disease, the personal difference and the conditions of the surrounding tissues around the lesion site (In this connection, reference should be made to G. Hansen et al., "Radiology", 136, 695 (1980); and I. E. Crooks, "I.E.E.E. Trans. Nucl. Sci.", NS-27, 1239 (1980)). For these reasons, unitary display of the NMR signals is sacrificed to result inevitably in devoid of interchangeability between the images to induce problems in analysis of the images, as reported by T. Araki et al., "Radiology", 150, 95 (1984).

In consideration of the aforementioned status quo of the NMR imaging technology, it is a natural demand for a reference or control specimen for the objective appraisal, judgement on the maintenance, control, adjustment, operational condition and performance condition and for the analysis of the displayed images. Examples of the materials proposed as those which may be used for the preparation of reference specimen in the NMR imaging method, include tetramethylsilane, hexamethyldisiloxane, hexamethyldisilane, neopentane, DSS (sodium 2,2-dimethyl-2-silapentano-5-sulfonate) and sodium 2,3-tetradeuterium-3-trimethylsilylpropionate. Although these materials are conveniently used in the chemical analysis as the materials for preparing reference specimens used to measure the chemical shifts of the NMR informations, they are not suited for use as the material for the reference specimen used to provide basic informations or factors (proton density $\rho$, $T_1$ and $T_2$) in the NMR diagnosis, at all.

In some cases, poly(methyl methacrylate) and a low density polyethylene have been used in an NMR system for the adjustment purpose. However, the poly(methyl methacrylate) is used merely for the inspection of the peak width of the chemical shift during the chemical analysis, and the low density polyethylene is used only for the adjustment of the level of radio frequency wave. The both materials have no utility as the reference materials used for the adjustment operation when the system is used for obtaining NMR informations concerning a living body.

It has been proposed to use water, an aqueous solution of manganese sulfate, nickel chloride or copper chloride, and sulfuric acid, as the standard for inspection and adjustment of the system, since the NMR diagnosis is applied for the diagnosis of a substance (i.e. a living tissue) containing a large quantity of water. However, water is improper for a standard material used in the NMR analysis at all, since $T_1$ and $T_2$ of water are seriously affected by temperature and is also affected by dissolved oxygen. On the other hand, it is extremely difficult to prepare a solution simulating NMR informations of a living tissue (water content, $T_1$ and $T_2$) by the use of any of the aforementioned solutions.

There are known in the art a variety of solids or gels containing water and having constructions resembling the living tissues, the examples being gelatin, agar, polyacrylamide, carrageenan, agarose, jam, boiled egg, KONNYAKU (devil's tongue), alginic acid gel and bean-curd. However, a material having a water content agreed with those of the internal organs of a living body(namely, having a water content of from about 70 to 85 wt%) and having the $T_1$ and $T_2$ values agreed with those of the internal organs of a living body has not yet been known (In this connection reference should be made to 0. Hechter et al., "Proc. Natl. Acad. Sci.", 46 783 (1960); C. Sterling et al., "Makromol. Chem.", 116, 140 (1968); D. E. Woessner et al., "J. Colloicl. Interface Sci.", 34, 283, 290 (1970); W. Derbyshire et al., "Disc. Farad, Soc.", 1974, 243; C. J. G. Bakkert et al., "Phys. Med. Biol.", 29, 1511 (1984); and R. M. Vre et al., "Mag. Res. Med.", 2, 176 (1985)). Although continuous attempts are made to improve the process for the preparation of these hydrogels so as to bring the NMR signals ($\rho$, $T_1$ and $T_2$) thereof close to those of the living tissues by admixing some quantity of impurities, such attempts have not succeeded as will be described hereinbelow. For instance, even a gelatin containing water considerably less than that of the living body has disadvantageously high $T_1$ and $T_2$ values. Although an approach for improving the properties of gelatin had been continued, such an approach produced no valuable fruit, since there appeared uneven gelation during the step of cross-linking and solidifying the gelatin. Anyway, it is not possible to bring the three factors, i.e. the water content (ranging within 70 to 85%), $T_1$ and $T_2$, close to those of the living tissues by the use of any gelatin composition. Although a polyacrylamide gel having a water content ranging from 70 to 85% may be prepared, such a gel has an exceedingly high $T_2$ value and is apt to lose uniform structure during the cross-linking polymerization (gelation) step. Agar or agarose has an exceedingly high $T_1$ value and a remarkably low $T_2$ value as compared with those of the living tissues.

Other known materials include bean-curd, carrageenan, alginic acid, boiled egg, poly(2-hydroxyethyl methacrylate) gel, Curdlan, carboxymethyl cellulose (CMC), acrylonitrile-starch graft gel (see E. B. Bagley et al., "Ind. Eng. Chem. Prod. Res. Dev.", 14, 105 (1975)), xanthane gum, Locust Bean Gum, tragacanth gum, furcellaran, methyl cellulose, casein, albumin, fucoidin, triethanolamine alginate, tamarind gum, karaya gum, gatti gum and jam (such as pectin gel). However, properties of all of these known materials cannot be brought to be equivalent to the water content and $T_1$ and $T_2$ values of the living tissues.

KONNYAKU has an excessively high water content and considerably high $T_1$ and $T_2$ values. Although poly(N-vinylpyrrolidone) has an adequate water content, it is to high in $T_1$ and $T_2$ values. Even if an adjusting agent, such as nickel, manganese, copper or graphite, is added to poly(N-vivylpyrrolidone), both of the $T_1$ and $T_2$ values thereof cannot be brought to the values equivalent to those of living tissues.

A gel having an adequate water content (ranging within 70 to 80 wt%) may be prepared by exposing an aqueous solution of polyvinyl alcohol to gamma-ray. However, the $T_1$ and $T_2$ values of the thus prepared gel are lowered as the results of exposure to gamma-ray.

Because of the fact that any of the known materials (chemical substances) have many demerits, as described above, a fresh tissue of an animal has been used reluctantly as the control material in practice. However, such an animal-originated material is deteriorated significantly with the lapse of time even when stored in a cold place, as reported by R. V. Damadian, U.S. Pat. No. 3,789,832 (1974), and significant differences are found between the samples extracted from individual animals of the same species. Under such circumstances, it should be reasonable and well-grounded to accept the opinion, which has been repeatedly pointed out that it is necessary to find out a water-containing material (for phantom) which is not originated from a living body (in other word, a chemical substance) and repeatedly usable for a long time while having substantially equivalent NMR informations ($\rho$, $T_1$ and $T_2$) and being improved in shape-retaining property and satisfactory moldability.

Copending U.S. patent application Ser. No. 855,109 filed Apr. 23, 1986 (Inventors: M. Nambu et al.) proposes a material or phantom for diagnosis by nuclear magnetic resonance imaging, which comprises a hydrogel prepared by casting an aqueous solution containing more than 8 wt% and not more than 50 wt% of a polyvinyl alcohol having a degree of hydrolysis of not less than 98 mol% and an average polymerization degree of not less than 1,000 into a mold, followed by freezing and thawing of the thus cast mass. The material proposed by this prior U.S. Pat. application has NMR properties ($\rho$, $T_1$ and $T_2$) and water content which are closely resembling those of soft living tissues, and thus a phantom satisfying the aforementioned requirements may be prepared by the use thereof.

In order to prevent a hydrogel having a high water content and prepared in accordance with the teaching of the prior U.S. patent application (Nambu et al.) from being air-dried, it is contained in a sealed container. When the hydrogel having NMR properties (water content, $T_1$ and $T_2$) is used as a model equivalent to a human body, such a hydrogel should be placed in a static magnetic field (surrounded by a coil for receiving radio-frequency waves) of an NMR imaging apparatus in an amount substantially the same as the volume of human body, and then the electric and magnetic circuits should be adjusted until the density of the image displayed on the display tube becomes uniform to ensure that the intensity of the signals becomes uniform.

The electric and magnetic circuits are then adjusted so that the differences in NMR properties are quantitatively displayed. In order to perform such an adjustement, two or more sample hydrogels having different water contents are placed simultaneously in the static magnetic field and a hydrogel having high water content is further placed in a space surrounding the sample hydrogels so that the dielectric constant and the magnetic susceptibility of the surrounding space resemble the living body. In practice, a number of small size containers each containing therein a hydrogel having high water content are stacked in the static magnetic field to simulate a living body, and then one or more small size containers are replaced by other small size containers in which other hydrogels having different NMR properties are contained. However, precise simulation of a living body cannot be accomplished by stacking a number of such small size containers each containing therein a hydrogel. For example, when cylindrical containers or bottles are stacked, only formed is a regular or rectangular hexahedron or a pyramid or frustum, and a head or, body portion of human body cannnot be precisely simulated. This problem may be tentatively overcome by using a majority of hydrogel contained in square-shaped bottles. However, considerable times and labors are necessitated to replace one or more desired bottles in the stack by bottles containing therein different hydrogels. In order to eliminate such time and labor consuming operations, a number of containers containing therein different hydrogels may be combined and bonded together to prepare an assembly for simulating a head or body portion of a living human body. However, it is inevitable that the degree of freedom is limited in combination of desired hydrogels having different in water contents so that they are disposed at desired positions in the static magnetic field. It is impracticable to prepare many assemblies by combining separately prepared hydrogels which are contained in different containers, in consideration of the maintenance and rapid selection thereof for comprehensive uses.

OBJECTS AND SUMMARY OF THE INVENTION

An object of this invention is to provide a phantom used for diagnosis by nuclear magnetic resonance (NMR) imaging, which is not originated from a living body, and yet has a stable NMR properties ($\rho$, $T_1$ and $T_2$) equivalent to those of a living tissue and in which a first hydrogel sample can be placed in a desired position of the static magnetic filed and if desired another second hydrogel sample having NMR properties different from those of the first hydrogel sample can be immediately replaced by the first hydrogel sample.

A phantom for diagnosis by nuclear magnetic resonance imaging, provided according to this invention, comprises a container made of a synthetic resin and having at least one opening into which a sample material is inserted, and a hydrogel sealingly contained in the container and prepared by a process comprising the steps of charging an aqueous solution of a polyvinyl alcohol into the container, cooling the aqueous solution of the polyvinyl alcohol to a temperature of not higher than minus 10° C. to obtain a cooled frozen mass, and thawing the cooled frozen mass.

Another object of the invention is to provide a method for determining the resolution power or discrimination capacity of an NMR imaging apparatus using the phantom.

DESCRIPTION OF THE INVENTION

Figure 1:
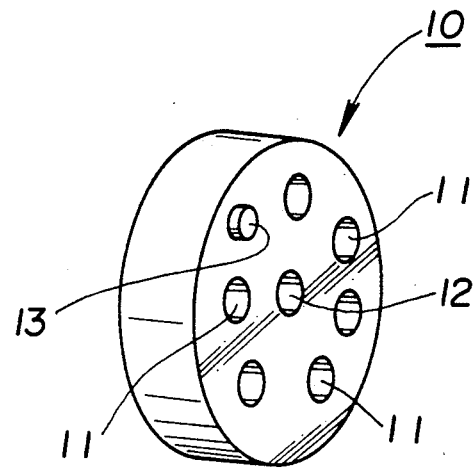
FIG. 1 is a perspective view showing one embodiment of the phantom of this invention used in diagnosis by nuclear magnetic resonance imaging.

The present invention will now be described in detail.

The phantom provided by this invention comprises a container made of a synthetic resin, and a hydrogel having high water content and sealingly contained in the container. The hydrogel contained in the container is prepared by the specific process. The container has a contour for defining at least one opening adapted to be filled with a sample material. The opening may be a through-hole extending from one side to the other side of the container or may be a blind bore formed at a desired position of the container. Preferably, the opening may have a shape of a cylinder having a diameter of from 2 to 200 mm.

In prepration of the phantom of this invention, an aqueous solution of a polyvinyl alcohol is charged through a port of the container made of a synthetic resin. Preferably, the polyvinyl alcohol, from which the hydrogel contained in the container is formed, may have a degree of hydrolysis of not less than 98 mol% and a polymerization degree of not less than 1,000. The polyvinyl alcohol is dissolved in water to prepare an aqueous solution containing, preferably more than 8 wt% and not more than 50 wt%, more preferably from 9 wt% to 45 wt%, of polyvinyl alcohol.

The general contour of the container may have a shape simulating a head or body portion of a human body to be placed in a static magnetic field, or a shape of a cylinder having a diameter of from 15 to 45 cm, so that the container filled with the hydrogel has NMR properties approximate to those of a living human body.

According to an important aspect of this invention, one or more openings, each preferably having a shape of cylindrical blind bore or cylindrical through-hole, are provided at desired portions on the wall (bottom, upper or side wall) of the container so that the openings are surrounded by the wall of the container. The length or depth of the openings, and the diameter of the cylinder when the void has a cylindrical shape, may be selected within a range of from 2 to 200 mm in consideration of the image resolution power of the used NMR imaging apparatus. At least one opening is defined by the wall of the container, although a plurality of openings may be formed at desired positions.

In order to obviate the influence by the magnetic field developed in the NMR imaging apparatus, the container should not be made of a metallic material but be made of a synthetic resin. Synthetic resins which may be used as the material for the container include acrylic resins, poly(vinylchloride) resins, polyethylene, polypropylene, polyamide, polystyrene, celluloid, cellulose acetate, chlorinated rubbers, phenolic resins, urea resins, melamine resins, fluorinated resins, polycarbonate, polyacetal resins, polyalkyleneoxide, alkyd resins, furan resins, unsaturated polyester resins, epoxy resins, polyurethane resins and silicone resins.

The hydrogel contained in the container may be prepared by charging an aqueous solution of a polyvinyl alcohol into the container, followed by cooling the aqueous solution of the polyvinyl alcohol to a temperature of not higher than $-$(minus) 10° C. to obtain a cooled frozen mass, and thawing the cooled frozen mass, whereby a phantom comprising a hydrogel having a high water content and contained in the sealed container is formed. The freezing and thawing steps may be repeated up to eight cycles to improve the modulus of elasticity of the hydrogel.

The only material for forming a hydrogel, i.e. a gel forming ingredient, used in the present invention is a polyvinyl alcohol. However, other ingredients or additives, which do not hinder gelation of polyvinyl alcohol, may be present in the aqueous solution of the polyvinyl alcohol, the amount of the coexisting additives being, for example, controlled in the range of not more than one half in weight of the weight of the polyvinyl alcohol.

Examples of the additives which do not hinder gelation of the polyvinyl alcohol are those which have been used as the agents for adjusting the NMR properties ($T_1$, $T_2$); the specific examples being gadolinium diethylenetriamine pentaacetate (D. H. Carr et al., "Lancet", Mar. 3, 484 (1984)), $Mn^{2+}$(G. Laukien et al., "Z. Phsik.",146, 113 (1956)),$Ni^{2+}$(R. Hausser, "Arch. Sci (Geneva)", 11, 252 (1958)), $Cu^{2+}$(R. Hausser et al., "Z. Physik", 182, 93 (1964), $Fe^{2+}$, $Fe^{3+}$(J. C. Gore et al, "Phys. Med. Biol.", 29, 1189 (1984)), glycerin, ethyl alcohol, isopropyl alcohol, agar, carrageenan, glucose and graphite. One or more of these additives may be directly, or in the form of an aqueous solution or suspension, added in the aqueous solution of polyvinyl alcohol under agitation so as to be dispersed uniformly therein, and then the aqueous solution or dispersion may be subjected to the subsequent freezing and the other treatment steps.

According to the present invention, the water contents of hydrogels may be arbitrarily varied to be agreed with the water contents of various living tissues. The water content of a certain hydrogel depends on the preparation or composition of the aqueous solution or suspension of polyvinyl alcohol used in the initial step. The water content of a hydrogel which is prepared by simple freezing and thawing (or subjecting to repeated freezing and thawing cycles) may be easily calculated, since the aqueous solution or suspension used at the initial step has been gelled.

Therefore, a certain phantom usable in the NMR diagnosis and prepared by the present invention has a predetermined water content set to simulate the water content of the specific living tissue, such as skin (Water content: 51 to 69%), ureter (Water Content: 58%), Lig. nuchae (Water Content: 58%), Achilles tendon (Water Content: 63%), tongue (Water Content: 60 to 68%), prostate (Water Content: 69 to 76%), lens (Water Content: 67 to 70%), liver (Water content: 73 to 77%), stomach (Water Content: 80%), pancreas (Water Content: 75%), small intestine (Water content: 80%), skeletal muscles (Water Content: 79 to 80%), uterus (Water Content: 80%), thymus (Water Content: 82%), bladder (Water Content: 82%) and kidney (Water Content: 78 to 81%). The phantoms prepared by the invention are characterized by the fact that they have the $T_1$ and $T_2$ values substantially agreed with those of the simulated living tissues.

In practical use of a phantom prepared in accordance with this invention, it is recommended to prepare a second container made of a synthetic resin and having a contour and dimensions to be snugly placed in the opening surrounded by the wall of the first container, and the thus prepared second container is filled with a hydrogel having a different water content and prepared by freezing and thawing of an aqueous solution of polyvinyl alcohol. The second container to be inserted in the opening may also be filled with an aqueous solution having known NMR properties, such as an aqueous solution of $Mn^{2+}$, $Ni^{2+}$, $Gd^{3+}$, $Ti^{3+}$, $VO^{3+}$, $V^{4+}$, $Cr^{3+}$, $Fe^{3+}$, $Fe^{2+}$, and $Dy^{3+}$, or ethyl alcohol or glycerin or an aqueous solution thereof to be used for checking the operation of an NMR imaging apparatus. Alternatively, the opening of the container may be filled with a fresh diseased tissue extracted from the lesion site and the NMR properties of the diseased tissue are compared with those of the phantom of this invention. In such a case, since the extracted tissue is changed abruptly with the laspse of time even when it is stored in a refrigerator, measurement should be performed immediately after extraction.

The phantom of this invention has a water content which may be varied within a wide range of from 50 to 92 wt% to cover the water contents of various living tissues which varies from 58 to 61% for the skin and Lig. nuchae to 78 to 82% for the liver and bladder.

The phantom of this invention has $T_1$ and $T_2$ values substantially agreed with those of a living tissue, and thus satisfy the requirements concerning the NMR informations (wter content, $T_1$ and $T_2$) for forming a model equivalent to a living tissue.

Since the phantom of this invention comprises a container defining an opening which may be filled with an inorganic or organic material or a hydrogel having different water content and having known NMR properties, it may be conveniently used for checking the sensitivity, quantitative analysing capacity and resolution power (discriminating faculty) of a certain NMR imaging apparatus; or the opening may be filled with a fresh diseased tissue immediately after removal thereof from a living tissue to learn the difference in NMR properties of the fresh diseased tissue from those of the phantom material of this invention.

The phantom of this invention may be provided with two or more openings which are filled with samples having different water contents. When a phantom having two openings is used and the openings are filled with first and second samples having different water contents, the NMR image thereof give informations which show the differences in NMR properties of the hydrogel contained in the container and the first and second samples. By interchanging the positions of the first and second samples, the positions of the inserted samples in the static magnetic field are replaced with each other so that the operation for the determination of resolution power and discrimination faculty at respective positions in the static magnetic field can be performed within a short time.

EXAMPLES OF THE INVENTION:

The present invention will now be described with reference to some Examples thereof. In the following Examples, "%" stands for "% by weight".

Example 1

An image inspection phantom 10 having the contour as shown in FIG. 1 was prepared.

A 20% aqueous solution of a polyvinyl alcohol having an average polymerization degree of 1,000 and a degree of hydrolysis of 98 mol% was charged into a generally cylindrical acrylic resin container having a diameter of 180 mm and a height of 166 mm. The container has one opening 12 having a shape of a through-hole (Diameter: 22 mm) extending from the top face to the bottom face of the container and positioned at the center of the container, and six openings 11 each having a shape of through-hole extending from the top face to the bottom face and having a diameter of 22 mm, the center of each of the latter-mentioned six through-holes being positioned at a distance of 50 mm from the center of the cylindrical container. The container was also provided with a port 13 having a diameter of 18 mm and pierced through the top face of the container. After charging the aqueous solution of polyvinyl alcohol through the port, the port was sealed. The aqueous solution of polyvinyl alcohol was frozen at − (minus) 30° C. and then thawed to prepare a phantom 10 filled with a hydrogel having a water content of 80%. The water content of thus prepared phantom is substantially agreed with the water content of skeletal muscles, small intestine, stomach, uterus and kidney (78 to 81%).

The thus prepared generally cylindrical phantom 10 was placed in a static magnetic field (1.5T) of an NMR diagnosis system at a position where a body portion or head of a patient is to be placed, and the images thereof were photographed from above along the vertical direction and along the horizontal plane (tomographical image), whereby the cylindrical contour of the phantom was precisely imaged and it was found that the image on the display tube had uniform brightness or intensity throughout the whole area of the phantom. It was also confirmed that all of the through-holes were precisely imaged.

Seven samples filled with hydrogels respectively having water contents of 76%, 77%, 78%, 79%, 80%, 81% and 82% were prepared by charging aqueous solutions of polyvinyl alcohol having an average polymerization degree of 1,000 and a degree of hydrolysis of 98 mol% into polypropylene bottles each having an outer diameter of 22 mm and a height of 166 mm followed by freezing and thawing. These seven samples were inserted in the through-holes or openings 11 and 12, and the tomographical NMR images were investigated. The hydrogel (Water Content: 80%) contained in the container of the phantom of this invention were distinctively imaged from the images of the hydrogels (Water Content: 79% and 81%) contained in the inserted samples. The images of the hydrogels in the inserted sample bottles were inspected to reveal that the change in water content by 1% could be distinctively identified. The relative positioning of the sample bottles were changed to prepare ten different combinations which were photographed, and the photographed NMR images were observed. The results of observation revealed that the change in water content by 1% could be distinctively identified throughout the whole area of the static magnetic field. Sample bottles filled with hydrogels having water contents of 70%, 72%, 75%, 83% and 85% were prepared, and inserted in the through-holes 11 of the phantom 10 together with the sample bottles filled with hydrogels having water contents of 77% and 81%. The $T_1$ value was measured by the inversion recovery method (Pulse Repetition Time $T_r = 3500$ ms, Pulse Delay Time $T_d = 50$ to 2000 ms), and the $T_2$ value was measured by the spin-echo method ($T_r = 2500$ ms, Echo Time $T_e = 30$ ms). The test results showed that the $T_1$ and $T_2$ were increased or extended as the water content was increased. The specific interrelation between the water content (70 to 83%) and the $T_1$ (ms) and $T_2$ (ms) values were: 70% ($T_1 = 445$, $T_2 = 41$), 72% ($T_1 = 500$, $T_2 = 50$), 75% ($T_1 = 583$, $T_2 = 68$), 77% ($T_1 = 650$, $T_2 = 80$), 80% ($T_1 = 735$, $T_2 = 80$), 81% ($T_1 = 770$, $T_2 = 120$), 83% ($T_1 = 820$, $T_2 = 157$), and 85% ($T_1 = 893$, $T_2 = 190$). The interrelations between the water content and the inverse numbers of $T_1$ and $T_2$ were linear, and the inverse number of the water content is in good linear interrelation with the inverse numbers of $T_1$ and $T_2$. It was further found that the logarithms of $T_1$ and $T_2$ values were in linear interrelation with the logarithm of the water content. From these results, it was recognized that the interrelations between the water content and the $T_1$ and $T_2$ values were in certain constant quantitative interrelations in that the $T_1$ and $T_2$ values were in proportion, respectively, to fourth power and seventh power of the water content.

The through-holes 11 and 12 were filled with seven aqueous solutions of $NiCl_2.6H_2O$ (1 mM, 2 mM, 3.4 mM, 4 mM, 8.5 mM, 16.9 mM and 25 mM), and the $T_2$ values of respective solutions were measured. The $T_2$ values (ms) of these sample solutions were, respectively, 1,000, 600, 316, 290, 177, 100 and 56. The results were agreed with the results of quantitative analysis by G. Laukien et al. (see "Z. Physik", 146 113 (1956)).

Example 2

Figure 2:
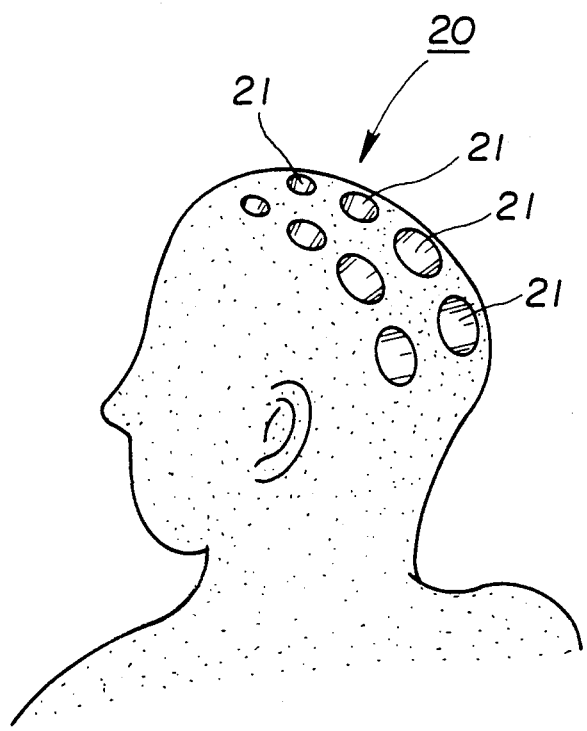
FIG. 2 is a perspective view showing another embodiment of the phantom of this invention used in diagnosis by nuclear magnetic resonance imaging.

A phantom 20 having the contour as shown in FIG. 2 was prepared. An aqueous solution of polyvinyl alcohol having a water content of 80% was charged into a polyvinylchloride container, and then cooled to — (minus) 20° C. to freeze the aqueous solution of polyvinyl alcohol, followed by thawing the frozen mass in the container. The container 20 had a countour simulating head and cervix portions of a human body, with the length from the vertex to the mentum being 225 mm, the length of the major axis of the vertex being 200 mm, the length of the minor axis of the vertex being 155 mm, the length of the major axis of the neck being 130 mm, the length of the minor axis of the neck being 120 mm, and the breadth of the shoulder being 1450 mm. Two for each of blind bores or recesses 21 having diameters of 3 mm, 5 mm, 7 mm, 10 mm and 20 mm were formed on the wall of the head portion. Each recess had a depth of 15 mm.

The thus prepared phantom 20 filled with hydrogel having a high water content was placed in the static magnetic field in the same NMR imaging apparatus as used in Example 1, and the tomographical images along the horizontal and vertical directions were photographed at photographing intervals of 3 mm. About 30 sheets of photographed image were taken for each of the horizontal and vertical tomographical photographing. The NMR imaging apparatus did not show any malfunction as long as the electric and magnetic systems of the apparatus were adjusted precisely from day to day while giving attention to the distortion and unevenness (in density of the images) of the images by the use of the phantom 20 prepared in this Example together with the phantom 10 prepared in Example 1. However, when such adjustment was not conducted for 2 days, images on 23 sheets (among 30 sheets) of photograph taken along the horizontal direction showed distortion and uneven density at the peripheral portion of the top of the head. The NMR imaging apparatus had been adjusted again, and a phantom 20 having the recesses 21 filled with a hydrogel separately prepared to have a water content of 79% was placed in the apparatus and the image of the thus prepared phantom was photographed and inspected. The results were that the hydrogels inserted in the recesses having outer diameters of 7 mm or more (inner diameters of 5 mm or more) were distinctively identified. The results revealed that the limit diameter which could be distinctively recognized was 5 mm, when the difference in water content was 1%.

It was also ascertained that the limit diameter which could be distinctively recognized lowered to about 8 mm, when the aforementioned precise adjustment of the electric and magnetic systems was not conducted for 2 days.

Although the present invention has been described with reference to the specific examples, it should be understood that various modifications and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

What is claimed is:

1. A method for determining resolution power or discrimination capacity of an NMR imaging apparatus comprising the steps of:
    (a) charging an aqueous solution of polyvinyl alcohol having predetermined NMR properties into a phantom comprising a first container made of synthetic resin and at least one opening surrounded by a wall of said container;
    (b) sealingly enclosing said aqueous solution of the polyvinyl alcohol within the container;
    (c) cooling the aqueous solution of said polyvinyl alcohol enclosed in the container to a temperature of not higher than minus 10° C. to obtain a cooled frozen mass;
    (d) thawing said cooled frozen mass to obtain a polyvinyl alcohol hydrogel contained within said container;
    (e) inserting a sample material into said opening, said sample material having different NMR properties from those of said polyvinyl alcohol hydrogel contained within said container;
    (f) placing said phantom and said sample material in a static magnetic field of said NMR imaging apparatus;
    (g) photographing an image of said phantom and said sample material; and
    (h) adjusting said NMR imaging apparatus so that said phantom and said sample material are distinctively recognized on said image.

2. The method as defined in claim 1, wherein, said opening has a contour of generally cylindrical shape.

3. The method as defined in claim 2, wherein said generally cylindrical opening defines a through-hole extending from one face of said container to another face of said container.

4. The method as defined in claim 2, wherein said generally cylindrical opening defines a blind bore formed on one face of said container.

5. The method as defined in claim 1, wherein said polyvinyl alcohol has an average polymerization degree of not less than 1,000 and a degree of hydrolysis of not less than 98 mol%.

6. The method as defined in claim 1, wherein said polyvinyl alcohol hydrogel contains 50 to 92% of water.

7. The method as defined in claim 1, wherein said aqueous solution contains an additional ingredient which does not hinder gelation of said polyvinyl alcohol in an amount of alcohol contained in said aqueous solution.

8. The method as defined in claim 7, wherein said additional ingredient is selected from the group consisting of gadolinium diethylenetriamine pentaacetate, $Mn^{2+}$, $Ni^{2+}$, $Cu^{2+}$, $Fe^{2+}$, $Fe^{3+}$, glycerin, ethyl alcohol, isopropyl alcohol, agar, carrageenan, glucose, graphite and a mixture thereof.

9. The method as defined in claim 1, wherein said first container is made of synthetic resin selected from the group consisting of acrylic resins, polyethylene, polypropylene, polyamides, polystyrene, celluloid, cellulose acetate, chlorinate rubbers, phenolic resins, urea resins, melamine resins, fluorinated resins, polycarbonate, polyacetal resins, polyalkyleneoxide, alkyd resins, furan resins, unsaturated polyester resins, and silicone resins.

10. The method as defined in claim 1, wherein said freezing step and thawing step are repeated up to eight cycles.

11. The method as defined in claim 1, wherein said container has a port through which said aqueous solution of polyvinyl alcohol is charged.

12. The method as defined in claim 1, wherein said sample material comprises a second container made of a synthetic resin and a frozen and thawed polyvinyl alcohol hydrogel contained therein, said second container being snugly placed in said opening of said phantom, said frozen and thawed polyvinyl alcohol hydrogel in said second container having different water content from said polyvinyl alcohol hydrogel contained in said first container.

13. The method as defined in claim 1, wherein said sample material comprises a second container made of a synthetic resin and material having known NMR properties contained therein, said material having known NMR properties being selected from the group consisting of aqueous solutions of $Mn^{2+}$, $Ni^{2+}$, $Cu^{2+}$, $Gd^{3+}$, $Ti^{3+}$, $VO^{3+}$, $V^{4+}$, $Cr^{3+}$, $Fe^{3+}$, $Fe^{2+}$, $CO^{2+}$ and $Dy^{3+}$, an aqueous solution of ethyl alcohol, glycerin and mixtures thereof.

14. The method as defined in claim 1, wherein said sample material is a fresh diseased tissue extracted from a lesion site.

15. The method as defined in claim 1, wherein said phantom comprises a plurality of said openings and wherein sample materials having different NMR properties are inserted into each of said openings.

16. The method as defined in claim 15, wherein after said sample materials having different NMR properties are photographed in said step (g) and after said NMR imaging sample materials are interchanged in their positions followed by performing said steps (f) to (h).

* * * * *